US012622063B2

(12) United States Patent
Choi et al.

(10) Patent No.: US 12,622,063 B2
(45) Date of Patent: May 5, 2026

(54) DISPLAY DEVICE

(71) Applicant: LG Display Co., Ltd., Seoul (KR)

(72) Inventors: Won-Jun Choi, Paju-si (KR); Hyun-Woo Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 358 days.

(21) Appl. No.: 18/349,850

(22) Filed: Jul. 10, 2023

(65) Prior Publication Data

US 2024/0222393 A1 Jul. 4, 2024

(30) Foreign Application Priority Data

Dec. 30, 2022 (KR) ........................ 10-2022-0190045

(51) Int. Cl.

*H10D 86/60* (2025.01)
*H01L 25/16* (2023.01)
*H10D 86/40* (2025.01)

(52) U.S. Cl.

CPC ........... *H10D 86/60* (2025.01); *H10D 86/443* (2025.01)

(58) Field of Classification Search

None

See application file for complete search history.

(56) References Cited

U.S. PATENT DOCUMENTS

2007/0047352 A1 3/2007 Lin et al.
2022/0102477 A1 3/2022 Sim et al.

FOREIGN PATENT DOCUMENTS

KR 20050112840 A * 12/2005
KR 10-0578845 B1 5/2006
KR 10-2021-0029474 A 3/2021
KR 10-2021-0079600 A 6/2021

OTHER PUBLICATIONS

English translation of KR20210029474A (Year: 2021).*
English translation of KR20050112840A (Year: 2005).*
European Patent Office, Extended European Search Report, European Patent Application No. 23187458.7, Nov. 2, 2023, 10 pages.

* cited by examiner

*Primary Examiner* — Bo B Jang

(74) *Attorney, Agent, or Firm* — Fenwick & West LLP

(57) ABSTRACT

A display device includes: a plurality of pad electrodes disposed in a non-display area of a substrate of at least one display panel; a plurality of routing electrodes formed along a top surface, a lateral surface and a rear surface of a side portion of the substrate, respectively connected to the plurality of pad electrodes to transmit corresponding driving signals, and containing Ag paste; a conductive pattern surrounding the routing electrode; and a boost circuit that outputs an output voltage obtained by boosting a DC input voltage to the conductive pattern, wherein the output voltage has a higher potential than that of the driving signal.

22 Claims, 9 Drawing Sheets

DISPLAY DEVICE

CROSS REFERENCE TO RELATED APPLICATIONS

The present application claims the priority benefit of Korean Patent Application No. 10-2022-0190045 filed in Republic of Korea on Dec. 30, 2022, which is hereby incorporated by reference in its entirety for all purposes as if fully set forth herein.

BACKGROUND

Field of the Invention

The present invention relates to a display device, and specifically, to a display device that can prevent ionization migration of routing electrodes to prevent open defect.

Discussion of the Related Art

Recently, a flat panel display device having excellent characteristics such as thinness, light weight, and low power consumption has been widely developed and applied to various fields.

As such the flat panel display device, a liquid crystal display device, a light emitting display device, and the like can be used. As the light emitting display device, an organic light emitting display device having an organic light emitting diode, an LED display device having a micro-sized light emitting diode formed of an inorganic material, and the like can be used.

Recently, in order to realize a large-area display device, a plurality of small display panels may be arranged in a tiling method.

In such a tiling type display device, a bezel of a display panel is formed with a very small width so that a user cannot recognize a connection portion between adjacent display panels.

As such, since the bezel of the display panel is very small, a side routing method of using Ag (silver) paste as a routing electrode along a side portion of the substrate is used to connect a pad electrode on the substrate of the display panel to a driving circuit on a back of the substrate.

In this case, a migration defect may occur in which the Ag routing electrode on the pad electrode moves due to a potential difference with an electrode or wiring inside the display panel, and thus the pad electrode and the routing electrode may become electrically open, thereby preventing signals from being normally transmitted from the driving circuit to the pad electrode via the Ag routing electrode.

SUMMARY

Accordingly, the present invention is directed to a display device that substantially obviates one or more of the problems due to limitations and disadvantages of the related art.

An advantage of the present invention is to provide a display device which can relieve or improve a migration defect of an Ag routing electrode in a display panel of a tiling type display device.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, a display device includes: a plurality of pad electrodes disposed in a non-display area of a substrate of at least one display panel; a plurality of routing electrodes formed along a top surface, a lateral surface and a rear surface of a side portion of the substrate, respectively connected to the plurality of pad electrodes to transmit corresponding driving signals, and containing Ag paste; a conductive pattern surrounding one or more of the routing electrodes; and a boost circuit that outputs an output voltage obtained by boosting a DC input voltage, the output voltage having a higher potential than that of the driving signals and being output to the conductive pattern.

In another embodiment, a display device comprises a plurality of pad electrodes disposed in a non-display area of a substrate of at least one display panel; and a plurality of routing electrodes formed along a top surface, a lateral surface and a rear surface of a side portion of the substrate, respectively connected to the plurality of pad electrodes to transmit corresponding driving signals, and containing Ag paste, wherein at least one of the pad electrodes includes an extension portion extending beyond a contour of the corresponding routing electrode on which the at least one of the pad electrodes is disposed and surrounding the corresponding routing electrode.

In still another embodiment, a display device includes one or more display panels, at least one of the display panels comprising: a plurality of pad electrodes disposed in a non-display area of a substrate of the at least one of the display panels; a driving circuit disposed on the substrate; a plurality of routing electrodes each electrically connecting a corresponding one of the pad electrodes to the driving circuit; and a plurality of conductive patterns each surrounding at least a part of a corresponding one of the routing electrodes, wherein a first voltage is applied to a first one of the conductive patterns; wherein a second voltage is applied to a first one of the routing electrodes corresponding to and surrounded by the first one of the conductive patterns; and wherein the first voltage is higher than the second voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE ILLUSTRATED EMBODIMENTS

Figure 1:
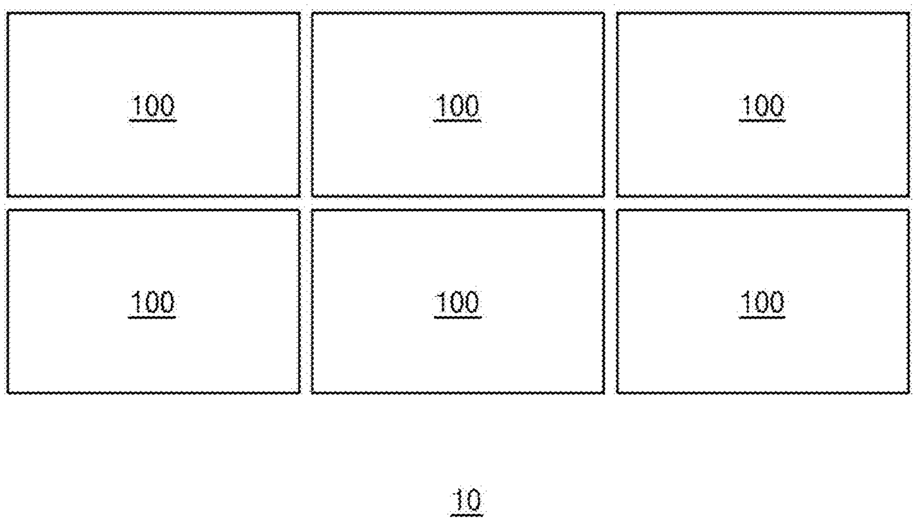
FIG. 1 is a view schematically illustrating a tiling type display device according to a first embodiment of the present invention.

Advantages and features of the present invention and methods of achieving them will be apparent with reference to the embodiments described below in detail with the accompanying drawings. However, the present invention is not limited to the embodiments disclosed below, but can be realized in a variety of different forms, and only these embodiments allow the present invention to be complete. The present invention is provided to fully inform the scope of the invention to the skilled in the art of the present invention, and the present invention is defined by the scope of the claims.

The shapes, sizes, proportions, angles, numbers, and the like disclosed in the drawings for explaining the embodiments of the present invention are illustrative, and the present invention is not limited to the illustrated matters. The same reference numerals refer to the same components throughout the description.

Furthermore, in describing the present invention, if it is determined that a detailed description of the related known technology unnecessarily obscure the subject matter of the present invention, the detailed description thereof can be omitted. When 'comprising', 'including', 'having', 'consisting', and the like are used in this invention, other parts can be added unless 'only' is used. When a component is expressed in the singular, cases including the plural are included unless specific statement is described.

In interpreting the components, even if there is no separate explicit description, it is interpreted as including a margin range.

In the case of a description of a positional relationship, for example, when the positional relationship of two parts is described as 'on', 'over', 'above', 'below', 'beside', 'under', and the like, one or more other parts can be positioned between such two parts unless 'right' or 'directly' is used.

In the case of a description of a temporal relationship, for example, when a temporal precedence is described as 'after', 'following', 'before', and the like, cases that are not continuous can be included unless 'directly' or 'immediately' is used.

Respective features of various embodiments of the present invention can be partially or wholly connected to or combined with each other and can be technically interlocked and driven variously, and respective embodiments can be independently implemented from each other or can be implemented together with a related relationship.

In describing components of the present invention, terms such as first, second and the like can be used. These terms are only for distinguishing the components from other components, and an essence, order, order, or number of the components is not limited by the terms. Further, when it is described that a component is "connected", "coupled" or "contact" to another component, the component can be directly connected or contact the another component, but it should be understood that other component can be "interposed" between the components.

"At least one" should be understood to include all combinations of one or more of associated components. For example, meaning of "at least one of first, second, and third components" means not only the first, second, or third component, but also all combinations of two or more of the first, second and third components.

Features of various embodiments of the present invention can be partially or wholly combined with each other, technically various interlocking and driving thereof are possible, and embodiments can be implemented independently from each other or can be implemented together in a related relationship.

Hereinafter, embodiments of the present invention are described in detail with reference to the drawings. Meanwhile, in the following embodiments, the same and like reference numerals are assigned to the same and like components, and detailed descriptions thereof may be omitted.

First Embodiment

Figure 2:
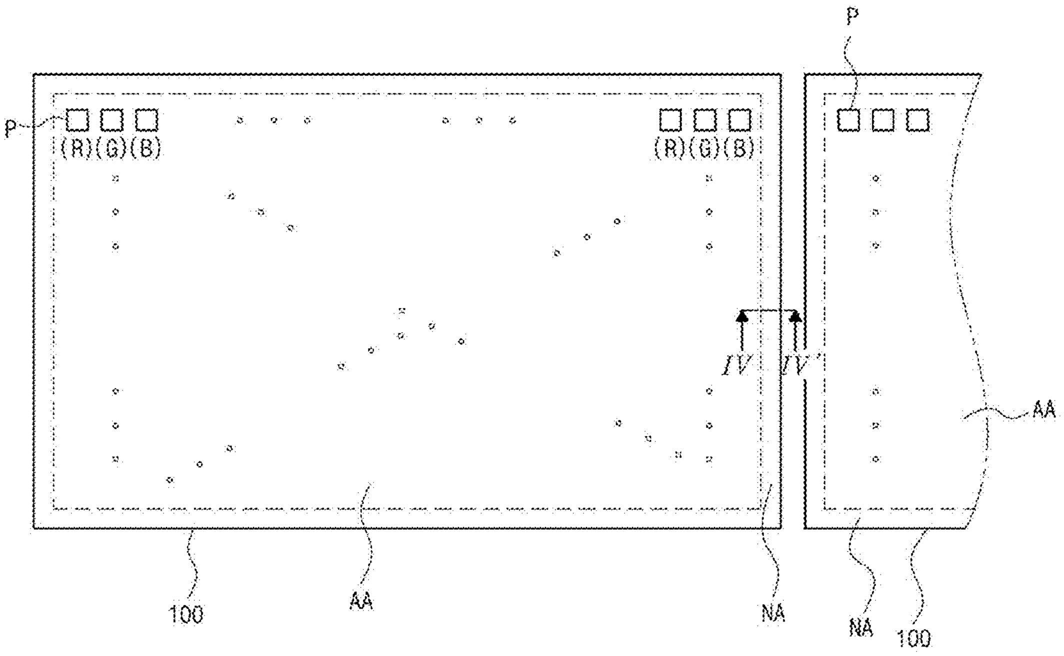
FIG. 2 is a view schematically illustrating a display panel of a display device according to a first embodiment of the present invention.
Figure 3:
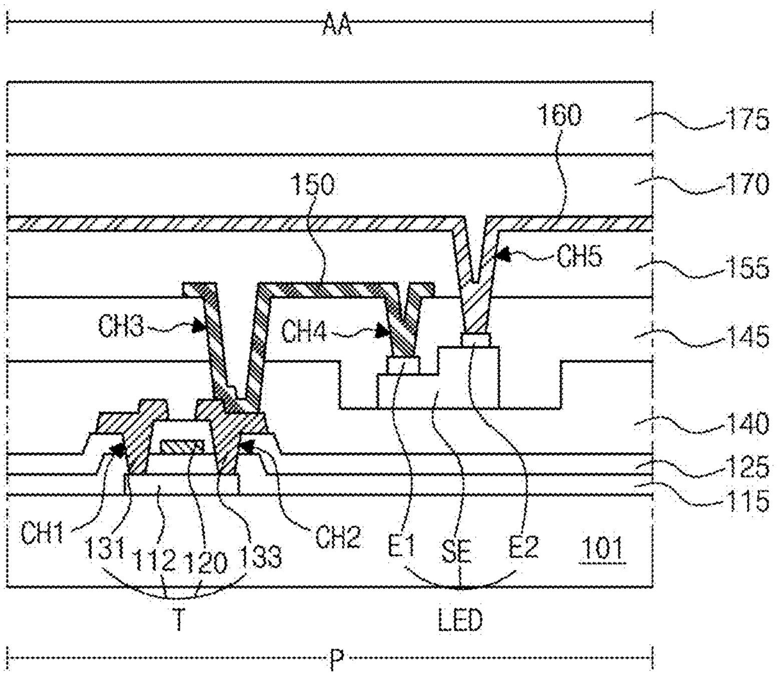
FIG. 3 is a cross-sectional view schematically illustrating a pixel of a display panel according to a first embodiment of the present invention.

FIG. 1 is a view schematically illustrating a tiling type display device according to a first embodiment of the present invention. FIG. 2 is a view schematically illustrating a display panel of a tiling type display device according to a first embodiment of the present invention. FIG. 3 is a cross-sectional view schematically illustrating a pixel of a display panel according to a first embodiment of the present invention.

Referring to FIG. 1, the display device 10 according to the first embodiment of the present invention may be a display device in which a plurality of display panels 100 are closely arranged in a tiling method to form a single screen.

The plurality of display panels 100 may be arranged, for example, in a matrix form in a plurality of horizontal lines (or row lines) and vertical lines (or column lines) to realize the tiling type display device 10.

Meanwhile, although not specifically shown in the drawings, in order to fix positions of the plurality of display panels 100 and couple them to each other, a structural means such as a fixing frame may be placed at the back (or the rear) of the display device 10 (or below the plurality of display panels 100).

Each of the plurality of display panels 100 may be, for example, an organic light emitting diode (OLED) display panel including an OLED formed using an organic light emitting material, or a light emitting diode (LED) display panel including an LED formed using an inorganic light emitting material. As another example, the display panel 100 may be a liquid crystal display panel including a liquid crystal element. Various types of display panels may be used as the display panel 100 of the present embodiment.

Meanwhile, for convenience of explanations, an LED display panel is taken as an example in this embodiment.

The display panel 100 is described with reference to FIG. 2. Referring to FIG. 2, a display area AA displaying an image and a non-display area NA, which is a bezel area around the display area AA, may be defined in the display panel 100.

In the display area AA of the display panel 100, a plurality of pixels P may be arranged on the display panel 100 in a matrix form along a plurality of row lines and a plurality of column lines on a substrate. Meanwhile, although not specifically shown in the drawings, a plurality of gate lines extending in a row direction and a plurality of data lines extending in a column direction may be formed on the substrate. Each pixel P may be connected to the corresponding gate line and data line.

The plurality of pixels P may include, for example, red (R), green (G) and blue (B) pixels which form a unit pixel displaying a color image and respectively display red (R), green (G) and blue (B) as different colors.

In each pixel P, a plurality of thin film transistors, at least one capacitor, and a light emitting diode may be formed on the substrate.

The structure of the pixel P is described with reference to FIG. 3. In FIG. 3, for convenience of explanations, a driving thin film transistor T as one example thin film transistor in the pixel P is shown by way of example.

A semiconductor layer 112 may be formed on an inner surface of the substrate 101 of the display panel 100. In this case, the semiconductor layer 112 may be made of amorphous silicon, polycrystalline silicon, or an oxide semiconductor material, but is not limited thereto.

The semiconductor layer 112 may include a central channel region and source and drain regions on both sides of the channel region.

A gate insulating layer 115 as an insulating layer made of an insulating material may be formed on the semiconductor layer 112. The gate insulating layer 115 may be formed of an inorganic insulating material such as silicon oxide or silicon nitride, but is not limited thereto.

A gate electrode 120 made of a conductive material such as metal may be formed on the gate insulating layer 115 to correspond to the channel region of the semiconductor layer 112.

In addition, the gate line connected to a gate electrode of a switching thin film transistor (not shown) may be formed on the gate insulating layer 115.

An inter-layered insulating layer 125 made of an insulating material may be formed on the gate electrode 120 and over the entire surface of the substrate 101. The inter-layered insulating layer 125 may be formed of an inorganic insulating material such as silicon oxide or silicon nitride, or may be formed of an organic insulating material such as benzocyclobutene or photo acryl, but is not limited thereto.

In the inter-layered insulating layer 125 and the gate insulating layer 115, a first contact hole CH1 and a second contact hole CH2 exposing the source region and the drain region of the semiconductor layer 112, respectively, may be formed.

The first contact hole CH1 and the second contact hole CH2 may be spaced apart from the gate electrode 120 on both sides of the gate electrode 120.

A source electrode 131 and a drain electrode 133 made of a conductive material such as metal may be formed on the inter-layered insulating layer 125.

In addition, on the inter-layered insulating layer 125, the data line may be formed that crosses the gate line and is connected to a source electrode of the switching thin film transistor.

The source electrode 131 and the drain electrode 133 may be spaced apart from each other with the gate electrode 120 at a center thereof, and may contact the source region and the drain region of the semiconductor layer 112 through the first contact hole CH1 and the second contact hole CH2, respectively.

The semiconductor layer 112, the gate electrode 120, the source electrode 131, and the drain electrode 133 may constitute the thin film transistor T.

As another example, the thin film transistor T may have an inverted staggered structure in which the gate electrode 120 is located below the semiconductor layer 112 and the source electrode 131 and the drain electrode 133 are located on the semiconductor layer 112.

A first passivation layer 140 as an insulating layer made of an insulating material may be formed on the source electrode 131 and the drain electrode 133 and over the entire surface of the substrate 101.

The first passivation layer 140 may be formed of an inorganic insulating material such as silicon oxide or silicon nitride, or an organic insulating material such as benzocyclobutene or photo acryl, but is not limited thereto.

On the first passivation layer 140, a light emitting diode LED may be disposed in each pixel P. The light emitting diode LED may be, for example, a micro light emitting diode having a micro size (e.g., 10 um to 100 um).

In this regard, for example, in each of the Red (R), Green (G), and Blue (B) pixels, R, G and B light emitting diodes LED emitting light of the corresponding colors may be disposed.

These light emitting diodes LED may be separately manufactured in the form of a chip, and may be disposed in each pixel P using a method such as transfer during a manufacturing process of the display panel 100.

Such light emitting diode LED may be an inorganic light emitting diode having an inorganic light emitting layer SE. For example, the light emitting layer SE may be formed using a III-V group semiconductor material (e.g., GaN).

Here, the light emitting layer SE may be, for example, an n-type semiconductor material layer, a p-type semiconductor material layer, and an active layer of a multi-quantum well structure disposed between the n-type semiconductor material layer and the p-type semiconductor material layer.

Further, the light emitting diode LED may include a first electrode E1 and a second electrode E2 which are two electrodes respectively contacting the n-type semiconductor material layer and the p-type semiconductor material layer of the light emitting layer SE. In this embodiment, for convenience of explanations, the case that the first electrode E1 contacts the n-type semiconductor material layer of the light emitting layer SE, and the second electrode E2 contacts the p-type semiconductor material layer of the light emitting layer SE is taken as an example. Conversely, the first electrode E1 may contact the p-type semiconductor material layer of the light emitting layer SE, and the second electrode E2 may contact the n-type semiconductor material layer of the light emitting layer SE.

The first and second electrodes E1 and E2 of the light emitting diode LED may be formed of a transparent conductive material (e.g., ITO), but are not limited thereto.

A second passivation layer 145 as an insulating layer made of an insulating material may be formed on the light emitting diode LED. The second protective layer 145 may be formed of an inorganic insulating material such as silicon oxide or silicon nitride or an organic insulating material such as benzocyclobutene or photo acryl, but is not limited thereto.

A third contact hole CH3 exposing the drain electrode 133 of the thin film transistor T may be formed in the second passivation layer 145 and the first passivation layer 140.

Further, a fourth contact hole CH4 exposing the first electrode E1 of the light emitting diode LED may be formed in the second passivation layer 145.

A connection electrode (or first connection electrode) 150 may be formed on the second passivation layer 145. The connection electrode 150 may be connected to the drain electrode 133 of the thin film transistor T through the third contact hole CH3. Further, the connection electrode 150 may be connected to the first electrode E1 of the light emitting diode LED through the fourth contact hole CH4.

As such, the thin film transistor T may be connected to the light emitting diode (LED) through the connection electrode 150. The connection electrode 150 may be formed of a transparent conductive material, but is not limited thereto.

A third passivation layer 155 may be formed on the connection electrode 150. The third passivation layer 155 may be formed of an inorganic insulating material such as silicon oxide or silicon nitride, or an organic insulating material such as benzocyclobutene or photo acryl, but is not limited thereto.

A fifth contact hole CH5 exposing the second electrode E2 of the light emitting diode LED may be formed in the third passivation layer 155.

A common electrode (or second connection electrode) 160 disposed substantially over the entire display area AA may be formed on the third passivation layer 155. For example, a power voltage (or driving voltage) for driving the light emitting diode LED, for example, a high potential power voltage VDD may be applied to the common electrode 160.

The common electrode 160 may be connected to the second electrode E2 of the light emitting diode LED of each pixel P through the fifth contact hole CH5. Accordingly, the high potential power voltage VDD may be applied to the second electrode E2 through the common electrode 160.

An adhesive layer 170 may be formed on the common electrode 160. The adhesive layer 170 may be formed of, for example, a transparent optical adhesive material such as OCA.

A protective film 175 may be positioned on the adhesive layer 170. The protective film 175 may be attached to the display panel 100 through the adhesive layer 170.

Meanwhile, a plurality of pad electrodes to which various driving signals for driving the display panel 100 are applied may be disposed in the non-display area NA of the display panel 100.

In this regard, for example, the plurality of pad electrodes to which driving signals are applied may be disposed in the non-display area NA close to the adjacent display panel 100 which is the non-display area NA at one side of the display panel 100.

Meanwhile, a driving circuit that is electrically connected to the plurality of pad electrodes and provides corresponding driving signals may be disposed on the back of the display panel 100 (or on the back of the substrate 101).

In order to connect the driving circuit and the pad electrodes, routing electrodes made of Ag paste may be formed on a side portion (or edge portion) which is a portion of the display panel 100 (or a portion of substrate 101) where the pad electrodes are formed.

In this regard, for example, the routing electrode may be formed along surfaces (i.e., the top surface, side surface, and rear surface) of the side portion of the substrate 101 of the display panel 100, so that the driving circuit positioned below the substrate 101 and the pad electrode formed on the substrate 101 may be connected in a side routing method through the routing electrode.

As such, by being connected in the side routing method, the display panel 100 can have a narrow bezel, so that a user can't substantially recognize the connection portion of the adjacent display panels 100 (i.e., the bezel area of the adjacent display panel 100). In this regard, for example, a width of each of the adjacent non-display areas NA of the adjacent display panels 100 may be less than or equal to a width (or pitch) of three pixels P which are red (R), green (G) and blue (B) pixels P.

Figure 4:
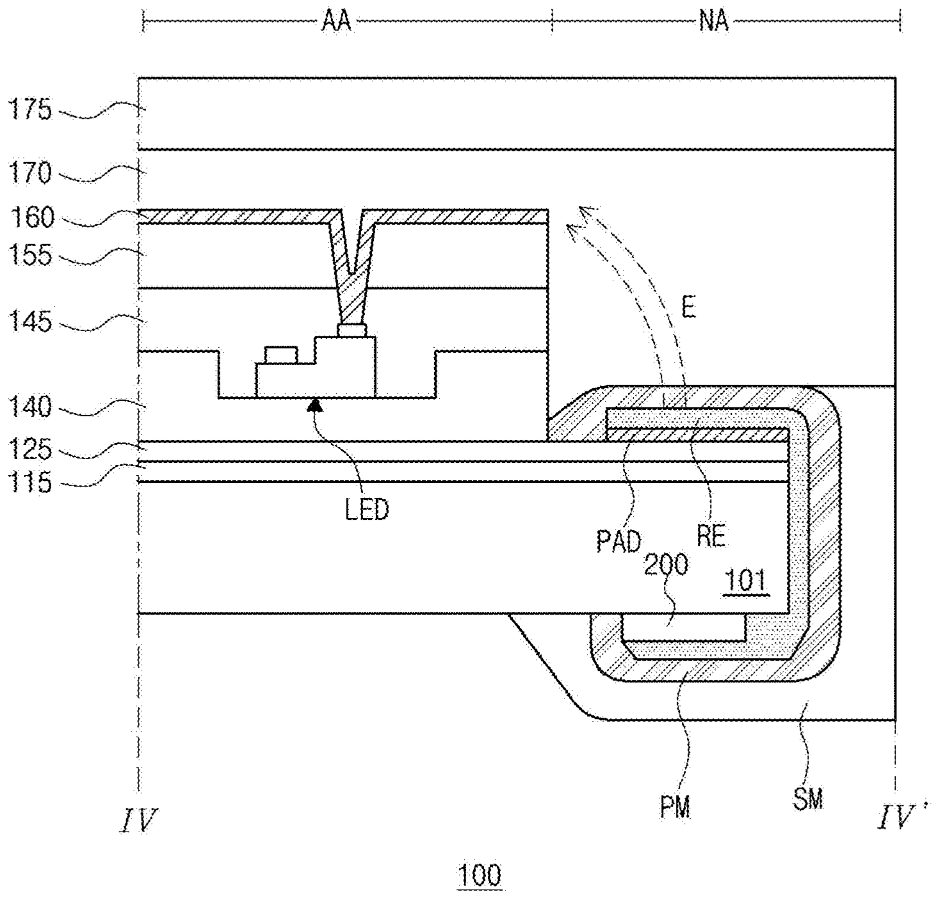
FIG. 4 is a cross-sectional view, taken along a line IV-IV' in FIG. 2, schematically illustrating a connection structure of a side routing method in a non-display area of a display panel according to a first embodiment of the present invention.

The connection structure of the side routing method is described with reference to FIG. 4. FIG. 4 is a cross-sectional view, taken along a line IV-IV' in FIG. 2, schematically illustrating a connection structure of a side routing method in a non-display area of a display panel according to a first embodiment of the present invention. Meanwhile, in FIG. 4, for convenience of explanations, the connection structure of the side lighting method is mainly illustrated, and other components are briefly illustrated.

Referring to FIG. 4, a pad electrode PAD may be formed on a top surface of the substrate 101, and a driving circuit 200 may be disposed under the rear surface of the substrate 101.

In this case, a routing electrode RE formed of Ag paste may be formed to extend along the top surface, rear surface and side surface of the side portion of the substrate 101.

In this regard, the routing electrode RE may include a rear part covering the rear surface of the substrate 101 and a lateral part covering the side surface of the substrate 101 (e.g., the side surface opposite to the side surface of the substrate 101 of the adjacent display panel 100), and a front part covering the top surface of the substrate 101.

Here, the rear part of the routing electrode RE may be connected to an output terminal of the driving circuit 200, and a front part of the routing electrode RE may be connected to the pad electrode PAD on the substrate 101.

As such, through the routing electrode RE extending from the rear to the front along the surfaces of the side portion of the substrate 101, the driving signal output from the driving circuit 200 may be transmitted to the corresponding pad electrode PAD.

Meanwhile, the display panel 100 may include a protection member PM covering and protecting the routing electrode RE. The protection member PM may be made of an organic insulating material, for example, may contain a black dye to have a black color.

Further, the display panel 100 may include a sealing member SM covering a side surface and a rear surface of the protection member PM. The sealing member SM may be formed of, for example, an elastic material.

The sealing members SM of the display panels 100 adjacent to each other may be arranged to be in close contact with each other, so that a space between the display panels 100 may be filled. Accordingly, the adjacent display panels 100 may be brought into close contact with each other as much as possible, and damage of component due to the close contact may be prevented.

Meanwhile, the adhesive layer 170 and the protective film 175 extending from the display area AA may be positioned on the sealing member SM and the protective member PM.

As described above, in the display panel 100 of this embodiment, the pad electrode PAD and the driving circuit 200 may be electrically connected through the routing electrode RE of Ag paste, so that the side spacing between the adjacent display panels 100 may be substantially minimized and the size of the non-display areas NA of the adjacent display panels 100 may be substantially minimized. Therefore, in the tiling type display device 10, the size of the bezel at the connection portion between the display panels 100 may be substantially minimized, so that the connection portion may not be recognized by the user.

Meanwhile, a potential difference may occur between the routing electrode RE of Ag paste and an electrode or wiring which is located around the routing electrode RE and has a relatively low potential, and thus a migration in which a position of the Ag paste is not fixed and migration may occur. In this case, the routing electrode RE of the Ag paste is not fixed to the pad electrode PAD, but moves in a direction of the electric field according to the potential difference, and as a result, a defect in which the routing electrode RE and the pad electrode PAD are electrically open may occur.

Figure 5:
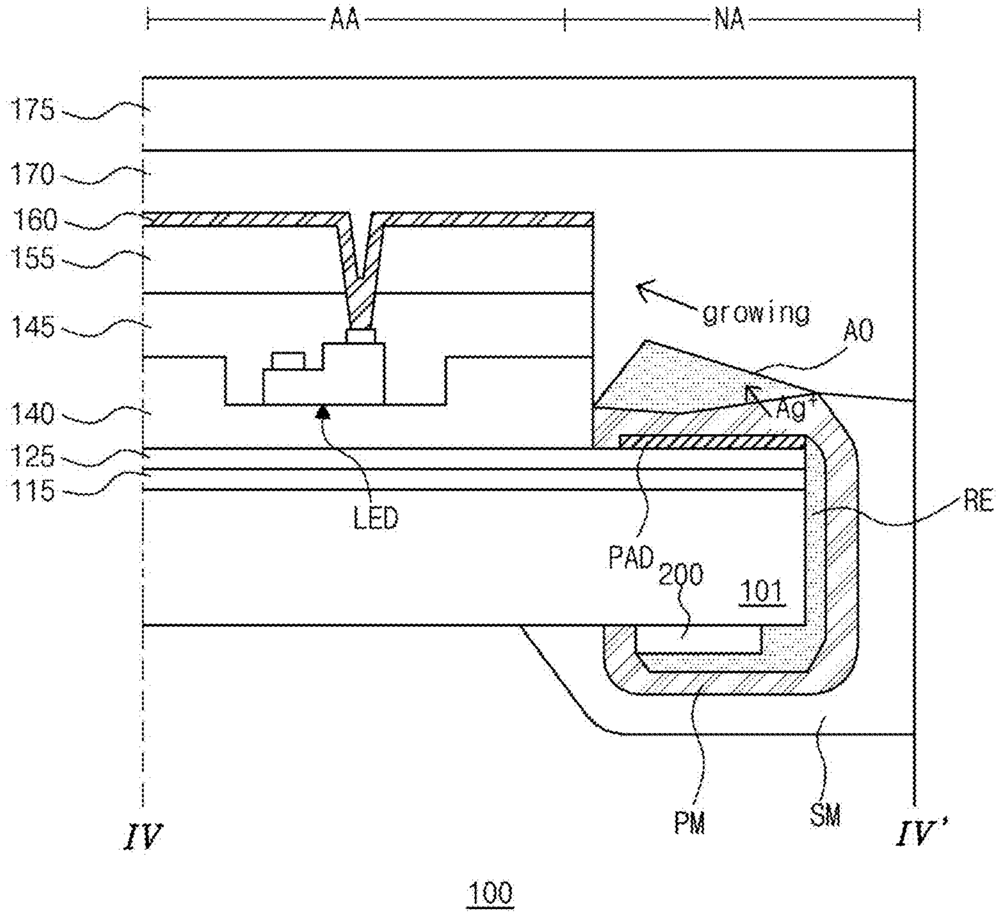
FIG. 5 is a view schematically illustrating how ionization migration of routing electrodes occurs in a non-display area of a display panel.

This is discussed with further reference to FIGS. 4 and 5.

Referring to FIG. 4, for example, while the pad electrode PAD may have a relatively high potential (e.g., 13V), an electrode located inside the common electrode 160, for example, the common electrode 160 may have a relatively low potential (e.g., 8V).

In this case, the pad electrode PAD serves as an anode having a relatively high potential, and the common electrode 160 serves as a cathode having a relatively low potential.

Accordingly, an electric field E directed from the pad electrode PAD of high potential to the common electrode 160 of low potential may be generated.

Due to the electric field E, in the routing electrode RE, ionization of Ag forming the routing electrode RE may be progressed, so that Ag+ may be generated. In addition, in the adhesive layer 170 in a wet state, ionization of $H_2O$, which is a water component contained in the adhesive layer 170, may be progressed, so that OH− may be generated.

At this time, since the electric field E is generated in the direction from the pad electrode PAD toward the common electrode 160, as shown in FIG. 5, $Ag^+$ of the routing electrode RE moves to an interface between the protective member PM and the adhesive layer 170 and combines with OH− of the adhesive layer 170.

Accordingly, as shown in the following chemical formula, $AgO_2$ AO, which is an Ag oxide, may be generated in the adhesive layer 170.

Chemical formula: $Ag^+ + OH \dashrightarrow 2AgOH \rightarrow Ag_2O + H_2O$.

The $AgO_2$ AO may grow into the display panel 100 along the adhesive layer 170.

As such, the routing electrode RE of the Ag paste acts as an anode for the surrounding low potential electrode (or wiring), and accordingly, the ionized material, Ag+, moves to the adhesive layer 170 to generate and grow the $AgO_2$ AO.

Due to this ionization migration, the routing electrode RE is reduced on the pad electrode PAD, and thus a contact resistance between the pad electrode PAD and the routing electrode RE increases, and as the ionization migration proceeds, an electrical open between the pad electrode PAD and the routing electrode RE may be caused.

In this regard, in the display device 10 of this embodiment, a conductive pattern (or a reverse potential conductive pattern), which is formed along a periphery of the routing electrode RE (or the pad electrode PAD) and has a potential higher than that of the routing electrode RE to prevent ionization migration of the routing electrode RE, may be provided.

Accordingly, since the routing electrode RE functions as a cathode with a relatively low potential and the conductive pattern formed around the routing electrode RE functions as an anode with a relatively high potential, the ionization migration of the routing electrode RE can be prevented (or minimized).

The migration prevention structure of the routing electrode RE is described in more detail below.

Figure 6:
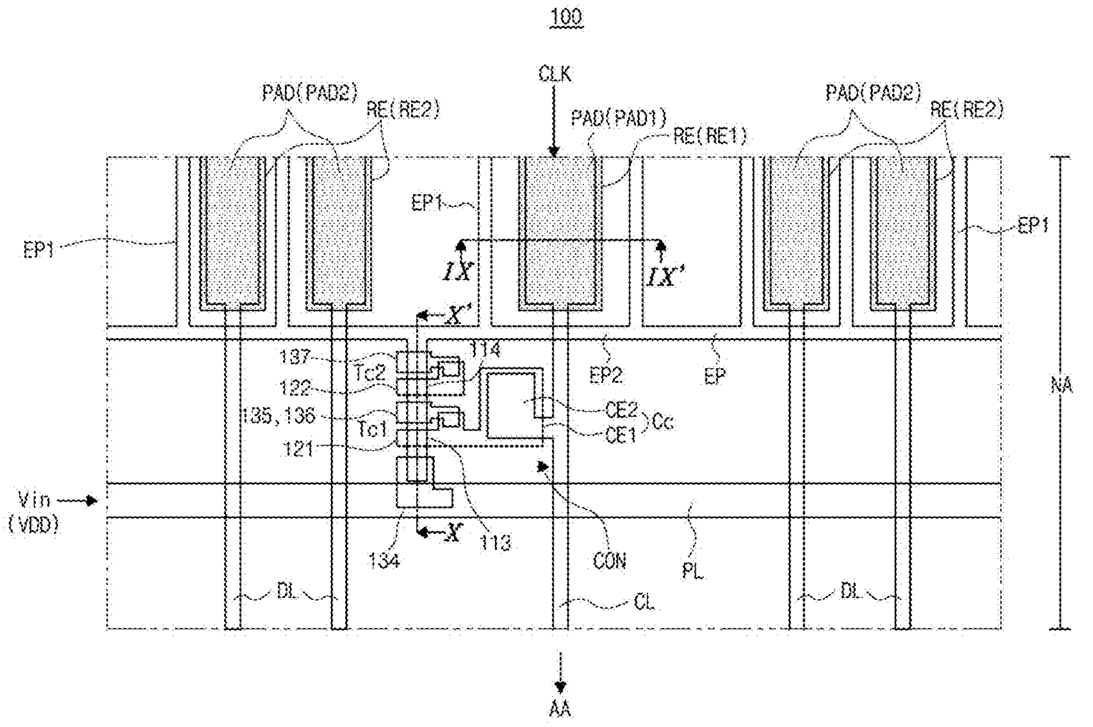
FIG. 6 is a plan view schematically illustrating a portion of a non-display area of a display panel according to a first embodiment of the present invention.
Figure 7:
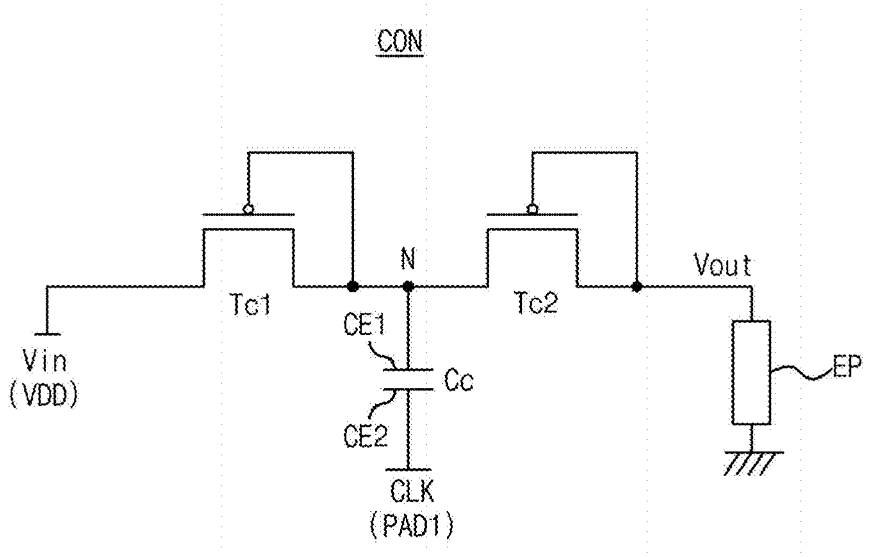
FIG. 7 is a circuit diagram of a boost circuit of a display panel according to a first embodiment of the present invention.
Figure 8:
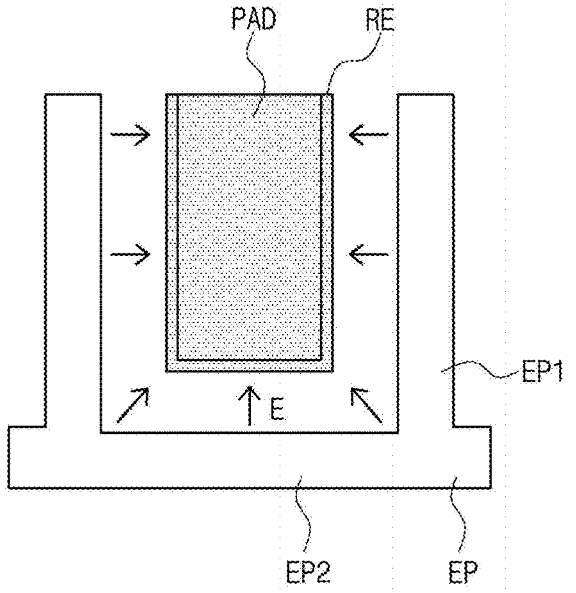
FIG. 8 is a view schematically illustrating an electric field between a pad electrode and a conductive pattern around the pad electrode of a display panel according to a first embodiment of the present invention.
Figure 9:
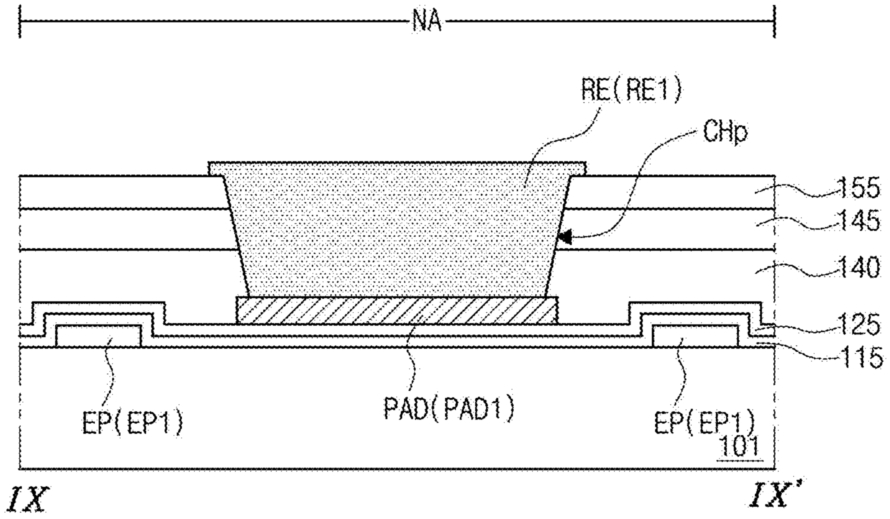
FIG. 9 is a cross-sectional view taken along a line IX-IX' in FIG. 6.
Figure 10:
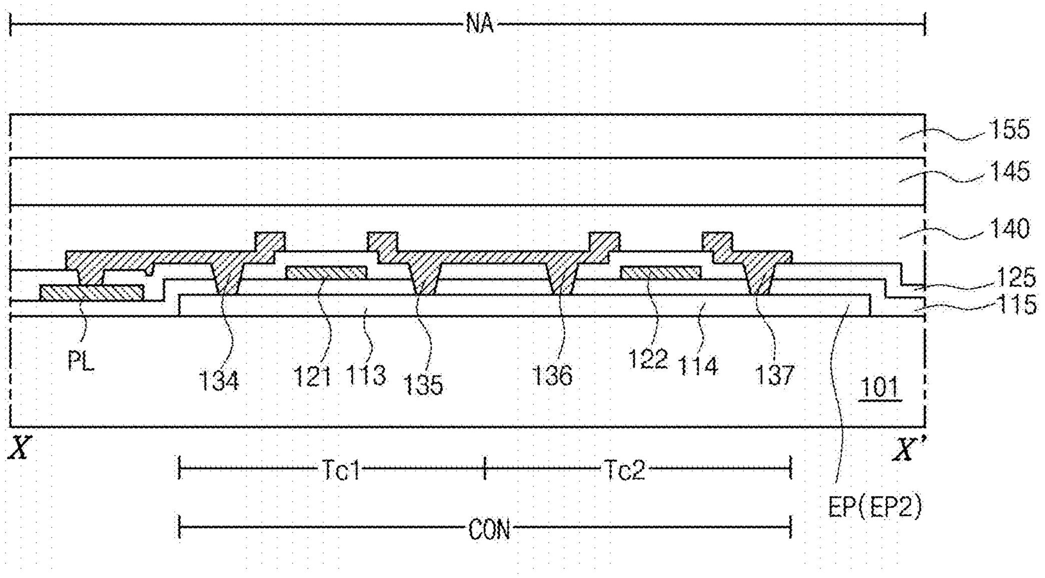
FIG. 10 is a cross-sectional view taken along a line X-X' in FIG. 6.

FIG. 6 is a plan view schematically illustrating a portion of a non-display area of a display panel according to a first embodiment of the present invention. FIG. 7 is a circuit diagram of a boost circuit of a display panel according to a first embodiment of the present invention. FIG. 8 is a diagram schematically illustrating an electric field between a pad electrode and a conductive pattern around the pad electrode of a display panel according to a first embodiment of the present invention. FIG. 9 is a cross-sectional view taken along a line IX-IX' in FIG. 6, and FIG. 10 is a cross-sectional view taken along a line X-X' in FIG. 6.

Referring to FIGS. 6 to 10, in the non-display area NA on the substrate 101 of the display panel 100 according to this embodiment, a plurality of pad electrodes PAD may be disposed. The plurality of pad electrodes PAD may include, for example, at least one clock pad electrode (or first pad electrode) PAD1 receiving a clock signal CLK and at least one data pad electrode (or second pad electrode) PAD2 receiving a data signal. In this embodiment, for convenience of explanations, one clock pad electrode PAD1 and four data pad electrodes PAD2 are shown.

As shown in FIG. 9, the pad electrode PAD may be located, for example, at the same layer as the source electrode (131 of FIG. 3) and the drain electrode (133 of FIG. 3) in the pixel (P in FIG. 3), and may be located on the inter-layered insulating layer 125.

On the plurality of pad electrodes PAD, a plurality of routing electrodes RE corresponding to the plurality of pad electrodes PAD, respectively, may be disposed. The plurality of routing electrodes RE may include, for example, a clock routing electrode RE1 corresponding to the clock pad electrode PAD1, and data routing electrodes RE2 corresponding to the data pad electrodes PAD2.

The routing electrode RE may be connected to the corresponding pad electrode PAD through a contact hole CHp. For example, as shown in FIG. 9, the routing electrode RE and the pad electrode PAD may be connected to each other through the pad contact hole CHp formed in the first to third passivation layers 140, 145 and 150 positioned between the routing electrode RE and the pad electrode PAD.

The routing electrode RE may have substantially the same size (e.g., width) as that of the corresponding pad electrode PAD, but is not limited thereto.

Meanwhile, the pad electrode PAD may be connected to a signal line that transmits a corresponding driving signal to an inside of the display panel 100. For example, the clock pad electrode PAD1 may be connected to a clock line CL that extends in a direction to the display area AA as a front direction of the clock pad electrode PAD1 and transmits the clock signal CLK. Here, the clock line CL may be connected to, for example, a GIP (gate-in panel) type gate driver formed in the non-display area NA of the substrate 101 of the display panel 100 to transmit the clock signal CLK, and the gate driver may generate a gate signal using the signal CLK.

In addition, the data pad electrode PAD2 may be connected to a data line DL that extends in a direction of the display area AA as a front direction of the data pad electrode PAD2 and transmits a data signal.

Further, in the non-display area NA on the substrate 101 of this embodiment, a boost circuit CON, and a conductive pattern EP which is connected to the boost circuit CON to receive a boosted high potential voltage Vout may be formed.

Referring to FIG. 7 in relation to the circuit configuration of the boost circuit CON, the boost circuit CON may include a first transistor Tc1 and a second transistor Tc2 which are connected in series with each other, and a capacitor Cc which is connected to a node N between the first and second transistors Tc1 and Tc2.

In this embodiment, for convenience of explanations, a case in which the first and second transistors Tc1 and Tc2 are formed of p-type transistors is taken as an example.

The first and second transistors Tc1 and Tc2 of the boost circuit CON may be formed in the same process as the thin film transistor (T of FIG. 3) in the pixel (P of FIG. 3).

An input terminal (or input electrode or first electrode) of the first transistor Tc1, for example, a first source electrode 134 may receive a DC (i.e., direct current) voltage as an input voltage Vin. Here, the DC input voltage Vin may use one of various DC driving voltages input to the display panel 100 to drive the display panel 100 (e.g., a high potential power voltage VDD, a low potential driving voltage, a reference voltage and the like). In this embodiment, the case of using the high potential power voltage VDD as the DC input voltage Vin is taken as an example. In this case, the first transistor Tc1 may be configured to be connected to a transmission line PL for transmitting the high potential power voltage VDD which is the input voltage Vin.

An output terminal (or output electrode or second electrode) of the first transistor Tc1, for example, a first drain electrode 135 may be connected to the node N and may also be connected to the corresponding first gate electrode 121 of the first transistor Tc1. As such, the first transistor Tc1 may be configured with a diode connection structure, and the diode connection structure may have a current path formed in a direction from the input terminal to the output terminal.

The second transistor Tc2 may be configured similarly to the first transistor Tc1. In this regard, an input terminal (or input electrode or first electrode) of the second transistor Tc2, for example, a second source electrode 136 may be connected to the node N. In addition, an output terminal (or output electrode or second electrode) of the second transistor Tc2, for example, a second drain electrode 137 may be connected to the conductive pattern EP which is a load on an output side of the boost circuit CON, and may also be connected to the corresponding second gate electrode 122 of the second transistor Tc2. As such, the second transistor Tc2 may have a diode connection structure, and the diode connection structure may have a current path formed in a direction from the input terminal to the output terminal.

The capacitor Cc may be connected between the node N and the clock pad electrode PAD1 (or the clock line CL). The capacitor Cc may have one electrode (or first electrode) CE1 connected to the node N, and the other electrode (or second electrode) CE2 connected to the clock pad electrode PAD1 to receive the clock signal CLK.

The boost circuit CON configured as above may boost the input voltage Vin (e.g., the high potential power voltage VDD) using the clock signal CLK, and may apply the boosted output voltage Vout to the conductive pattern EP.

Here, the potential of the output voltage Vout may be determined by the DC potential of the input voltage Vin and the amplitude of the clock signal CLK. In this regard, for example, when the high potential power voltage VDD (e.g., approximately 8V) is used as the DC input voltage Vin and the amplitude of the clock signal CLK is approximately 17V, the DC output voltage Vout may be approximately 25V.

FIG. 10 may be referred to in relation to a stacked structure of the boost circuit CON. In this regard, first and second semiconductor layers 113 and 114 as semiconductor layers respectively corresponding to the first and second transistors Tc1 and Tc2 may be formed on the substrate 101. The first and second semiconductor layers 113 and 114 may be formed in an integral pattern (or common pattern).

On the gate insulating layer 115 on the semiconductor layers 113 and 114, the first and second gate electrodes 121 and 122, which are gate electrodes of the first and second transistors Tc1 and Tc2, respectively, may be formed.

On the inter-layered insulating layer 125 covering the first and second gate electrodes 121 and 122, the first source electrode 134 and the first drain electrode 135, which are the source and drain electrodes of the first transistor Tc1, and the source electrode 136 and the second drain electrode 137, which are the source and drain electrodes of the transistor Tc2, may be formed.

Each of the first source electrode 134 and the first drain electrode 135 may contact the source region and the drain region of the first semiconductor layer 113 through the corresponding contact holes. Further, each of the second source electrode 136 and the second drain electrode 137 may contact the source region and the drain region of the second semiconductor layer 114 through the corresponding contact holes.

Here, the first drain electrode 135 and the second source electrode 136 may be formed in an integral pattern.

Meanwhile, the first drain electrode 135 and the first gate electrode 121 may be connected through a contact hole (not shown) formed in the inter-layered insulating layer 125 therebetween. Similarly, the second drain electrode 137 and the second gate electrode 122 may be connected through a contact hole (not shown) formed in the inter-layered insulating layer 125 therebetween.

Meanwhile, the second electrode CE2 of the capacitor Cc may be formed, for example, in a form of extending from the clock line CL, and the second electrode CE2 may be formed at the same layer as and of the same material as the first and second source electrodes 134 and 136 and the first and second drain electrodes 135 and 137.

Further, the first electrode CE1 of the capacitor Cc may be formed, for example, in a form of extending from the first gate electrode 121, and the first electrode CE1 may be formed at the same layer as and of the same material as the first and second gate electrodes 121 and 122.

The conductive pattern EP connected to the output terminal of the boost circuit CON and receiving the output voltage Vout of the boost circuit CON may be formed to surround the pad electrode PAD and the routing electrode RE that are in contact with each other.

In this regard, for example, the conductive pattern EP may include first pattern portions EP1 located on both sides in a width direction of the routing electrode RE and a second pattern portion EP2 located on a side toward the display area AA in a length direction of the routing electrode RE. For example, the second pattern portion EP2 may be formed to extend in a horizontal direction in the drawings, and the first pattern portion EP1 may be formed to branch off from the second pattern portion EP2 and extend to one end of the substrate 101.

As such, the conductive pattern EP may be disposed along the periphery of the routing electrode RE, so that the routing electrode RE may be substantially spatially isolated from the surrounding wires or electrodes by the conductive pattern EP.

The conductive pattern EP may be configured to have conductivity, and may include, for example, a doped semiconductor layer. In this regard, the conductive pattern EP may be formed of the same semiconductor material as the semiconductor layers 113 and 114 of the first and second transistors Tc1 and Tc2. Further, the semiconductor layers 113 and 114 of the first and second transistors Tc1 and Tc2 may be formed as an integral structure with the conductive pattern EP, and in this case, the semiconductor layers 113 and 114 may be configured to branch off from and extend from the conductive pattern EP.

As described above, since the conductive pattern EP to which the high potential output voltage Vout is applied is formed around the routing electrode RE, the routing electrode RE may serve as a cathode having a lower potential than the conductive pattern EP.

In this regard, for example, the output voltage Vout applied to the conductive pattern EP may have a potential of about 25V. Also, a high voltage of the clock signal CLK applied to the clock routing electrode RE1 may have a potential of about 13V. Further, the data signal applied to the data routing electrode RE2 may have a potential within a range of about 0V to 7V.

As such, the potential of the conductive pattern EP becomes higher than that of the routing electrode RE. Accordingly, regarding the conductive pattern EP and the routing electrode RE, the conductive pattern EP serves as an anode and the routing electrode RE serves as a cathode.

As a result, as shown in FIG. 8, an electric field E is generated in a direction from the conductive pattern EP of a high potential to the routing electrode RE of a low potential.

Compared to the case without the conductive pattern EP, in this embodiment in which the conductive pattern EP is disposed, the routing electrode RE becomes a cathode, so that the reverse electric field E toward the routing electrode RE occurs.

Accordingly, the high potential conductive pattern EP acts as a potential barrier against the movement of Ag ions (i.e., $Ag^+$) of the routing electrode RE, so that the Ag ions do not substantially move toward the periphery of the corresponding pad electrode PAD and can stay in a fixed position on the pad electrode PAD.

As described above, in this embodiment, the boost circuit CON which generates the output voltage Vout applied to the routing electrode RE and having a higher potential than the driving signal (e.g., the clock signal having the highest potential) is provided, and the conductive pattern EP to which this output voltage Vout is applied is disposed around the routing electrode RE.

Accordingly, since the routing electrode RE becomes a cathode having a low potential with respect to the conductive pattern EP, the routing electrode RE is prevented from ionization migration and can be positioned in a fixed state on the corresponding pad electrode PAD. Therefore, the contact state between the routing electrode RE and the pad electrode PAD is maintained without substantial change, and an electrical open defect between them can be prevented.

Figure 11:
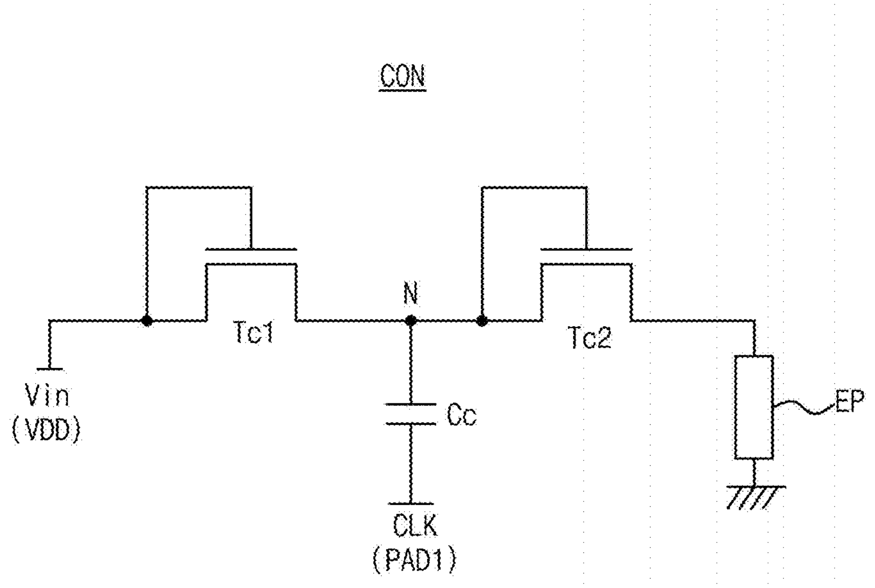
FIG. 11 is a circuit diagram of another example of a boost circuit according to a first embodiment of the present invention.

FIG. 11 is a circuit diagram of another example of a boost circuit according to a first embodiment of the present invention.

Referring to FIG. 11, the first and second transistors Tc1 and Tc2 of the boost circuit CON may be configured as n-type transistors.

Accordingly, the input terminal of the first transistor Tc1, for example, the first drain electrode may receive the input voltage Vin and be connected to the corresponding first gate electrode of the first transistor Tc1. Further, the output terminal of the first transistor Tc1, for example, the first source electrode may be connected to the node N.

Similar to the first transistor Tc1, the input terminal of the second transistor Tc2, for example, the second drain electrode is connected to the node N, and may also be connected to the corresponding second gate electrode of the second transistor Tc2. Further, the output terminal of the second transistor Tc2, for example, the second source electrode may be connected to the output terminal of the boost circuit CON.

As such, the connection positions of the electrodes implementing the diode connection structure in the case of the first and second transistors Tc1 and Tc2 being configured as the n-type transistors as shown in FIG. 11 are different from those in the above-described case of the first and second transistors Tc1 and Tc2 being configured as the p-type transistors as shown in FIGS. 7 and 10.

Second Embodiment

Figure 12:
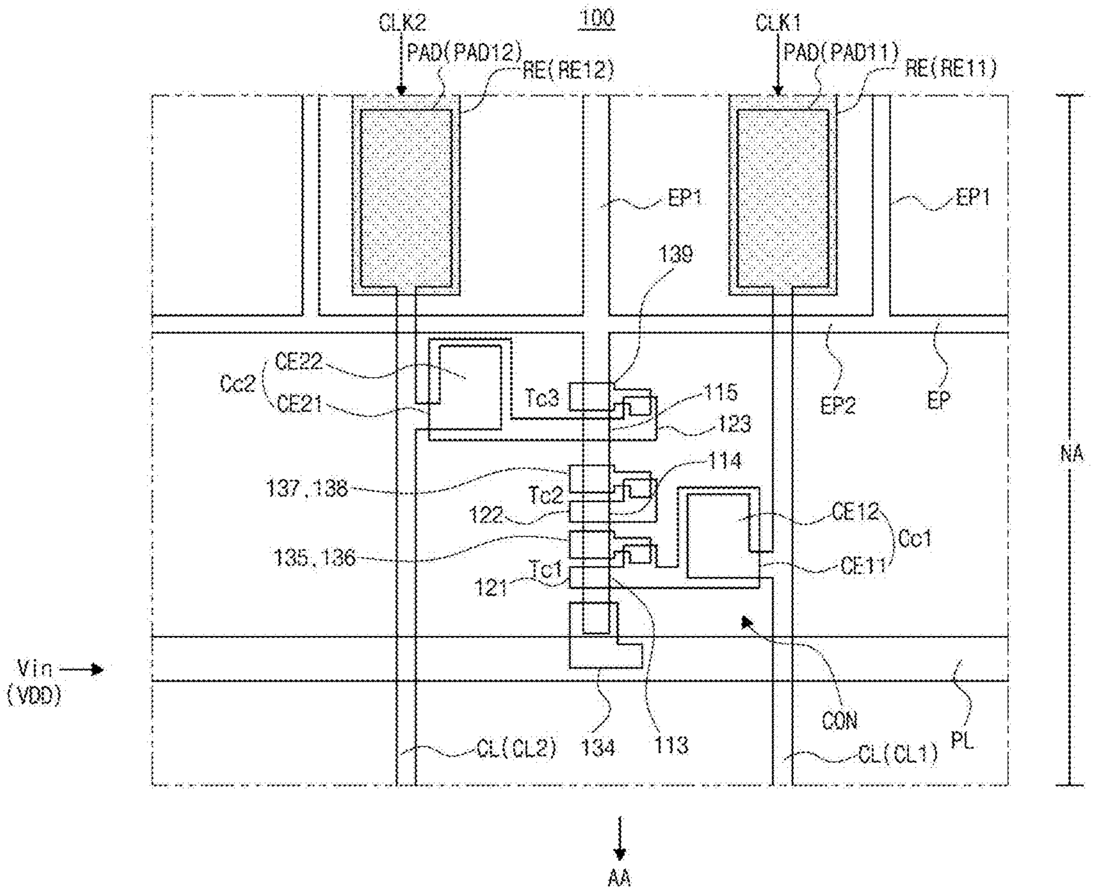
FIG. 12 is a view schematically illustrating a portion of a non-display area of a display panel of a tiling type display device according to a second embodiment of the present invention.
Figure 13:
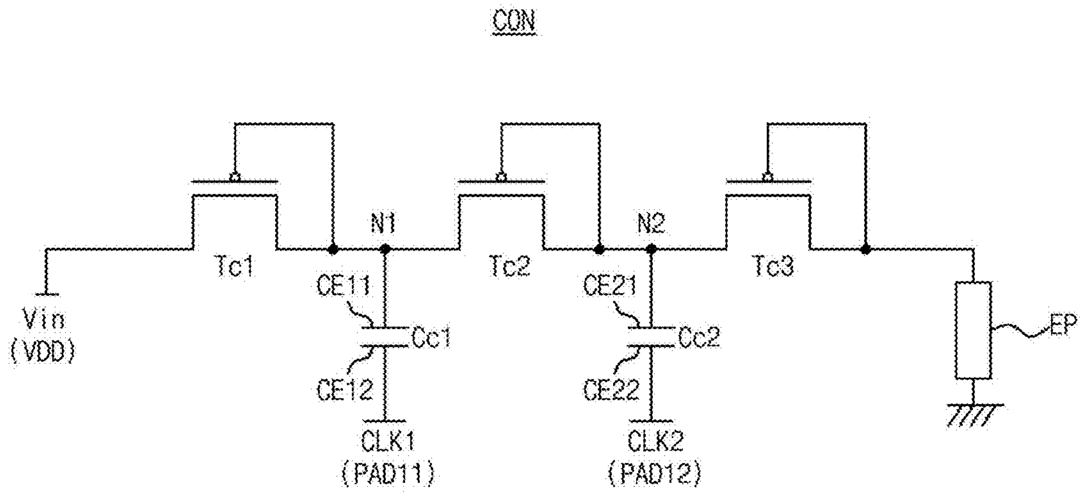
FIG. 13 is a circuit diagram of a boost circuit of a display panel according to a second embodiment of the present invention.

FIG. 12 is a view schematically illustrating a portion of a non-display area of a display panel of a tiling type display device according to a second embodiment of the present invention. FIG. 13 is a circuit diagram of a boost circuit of a display panel according to a second embodiment of the present invention.

In the following description, detailed explanations of the same or like parts of the first embodiment described above may be omitted.

In FIG. 12, for convenience of explanations, among a plurality of pad electrodes PAD disposed in the non-display area NA of the display panel 100, two clock pad electrodes PAD11 and PAD 12, to which different clock signals CLK1 and CLK2 are applied are shown as an example. However, the data pad electrode may be disposed in the non-display area NA, as in the first embodiment described above.

Referring to FIGS. 12 and 13, the display panel 100 of this embodiment may include a boost circuit CON having a higher boost rate compared to that of the first embodiment.

The boost circuit CON for increasing the boost rate includes three or more series-connected transistors Tc1, Tc2 and Tc3), and two or more capacitors Cc1 and Cc2 connected to nodes N1 and N2 between adjacent transistors.

Meanwhile, in this embodiment, for convenience of explanations, the boost circuit CON configured with three transistors, first to third transistors Tc1 to Tc3, and two capacitors, first and second capacitors Cc1 and Cc2 is taken as an example.

Regarding the pad electrodes PAD and the routing electrodes RE, the pad electrodes PAD may include first and second clock pad electrodes PAD11 and PAD12 which receive first and second clock signals CLK1 and CLK2 of different phases (or opposite phases) to each other.

Further, the routing electrode RE may include first and second clock routing electrodes RE11 and RE12 corresponding to the first and second clock pad electrodes PAD11 and PAD12, respectively.

Here, similarly to the above-described first embodiment, the routing electrode RE may be connected to the corresponding pad electrode PAD through a contact hole.

Referring to FIGS. 12 and 13 in relation to the circuit configuration of the boost circuit CON, the boost circuit CON may include first, second, and third transistors Tc1, Tc2, and Tc3 connected in series with each other, a first capacitor Cc1 connected to a first node N1 between the first and second transistors Tc1 and Tc2, and a second capacitor Cc2 connected to a second node N1 between the second and third transistors Tc1 and Tc2.

In this embodiment, for convenience of explanations, a case in which the first, second, and third transistors Tc1, Tc2, and Tc3 are configured as p-type transistors is taken as an example.

An input terminal of the first transistor Tel, for example, a first source electrode 134 may receive an input voltage Vin. Further, an output terminal of the first transistor Tc1, for example, a first drain electrode 135 may be connected to the first node N1 and may also be connected to the corresponding first gate electrode 121 of the first transistor Tc1.

Similar to the first transistor Tc1, an input terminal of the second transistor Tc2, for example, a second source electrode 136 may be connected to the first node N1. Further, an output terminal of the second transistor Tc1, for example, the second drain electrode 137 may be connected to the second node N2 and may also be connected to the corresponding second gate electrode 122 of the second transistor Tc2.

Similar to the first and second transistors Tc1 and Tc2, an input terminal of the third transistor Tc3, for example, a third source electrode 138 may be connected to the second node N2. Further, an output terminal of the third transistor Tc3, for example, a third drain electrode 139 may be connected to a conductive pattern EP, which is a load on an output side of the boost circuit CON, and may also be connected to the corresponding third gate electrode 123 of the third transistor Tc3.

The first capacitor Cc1 may be connected between the first node N1 and the first clock pad electrode PAD11 (or the first clock line CL1). In the first capacitor Cc1, a first electrode CE11 may be connected to the first node N1 and a second electrode CE12 may be connected to the first clock pad electrode PAD11 to receive the first clock signal CLK1.

The second capacitor Cc2 may be connected between the second node N2 and the second clock pad electrode PAD12 (or the second clock line CL2). In the second capacitor Cc2, a first electrode CE21 may be connected to the second node N2 and the second electrode CE22 may be connected to the second clock pad electrode PAD12 to receive the second clock signal CLK2.

The boost circuit CON configured as above may boost the input voltage Vin (e.g., the high potential power voltage (VDD)) using the first and second clock signals CLK1 and CLK2 of different phases, and may apply the boosted output voltage Vout to the conductive pattern EP.

As such, by using the first and second clock signals CLK1 and CLK2 having different phases, the output voltage Vout in which the amplitude of the clock signal is substantially increased may be generated.

Thus, compared to the first embodiment using a single clock signal, the boost rate of the boost circuit CON is increased, so that a higher potential output voltage Vout can be generated.

Accordingly, when the higher potential output voltage Vout is required for the conductive pattern EP, it can be satisfied.

In addition, since the potential of the conductive pattern EP can be higher, the prevention of ionization migration of the routing electrode RE can be further strengthened, so that the routing electrode RE is more strongly fixed on the pad electrode PAD and the open defect can be prevented more reliably.

Third Embodiment

Figure 14:
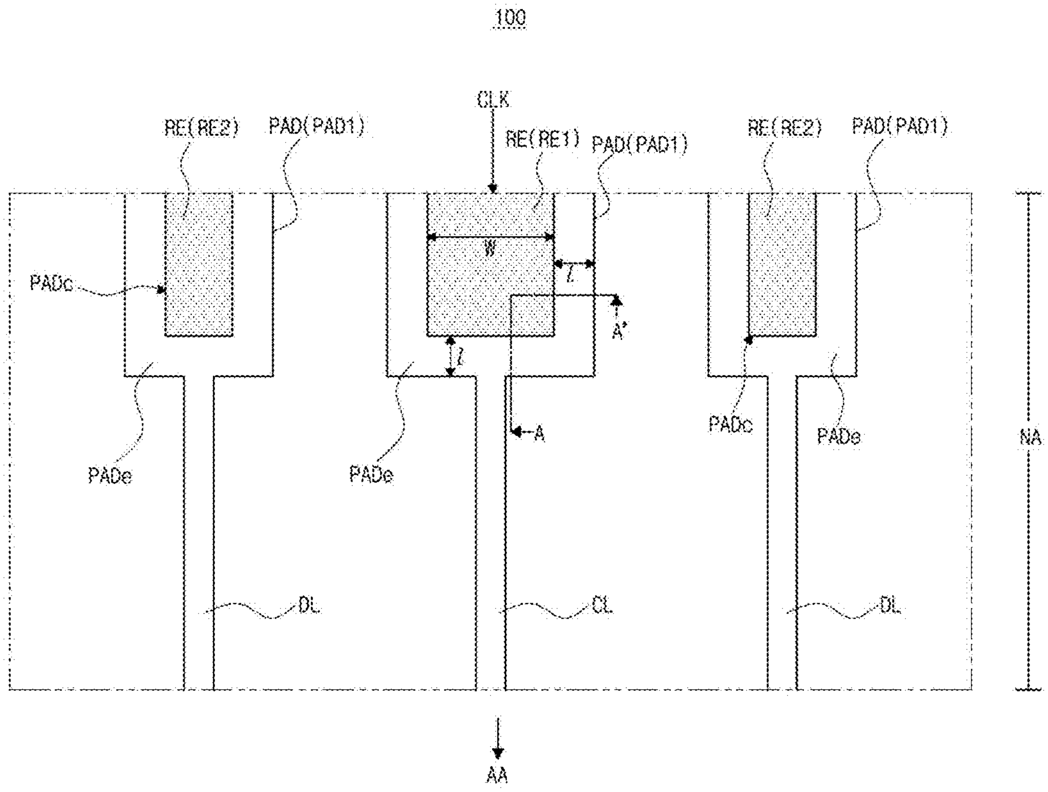
FIG. 14 is a view schematically illustrating a portion of a non-display area of a display panel of a tiling type display device according to a third embodiment of the present invention.
Figure 15:
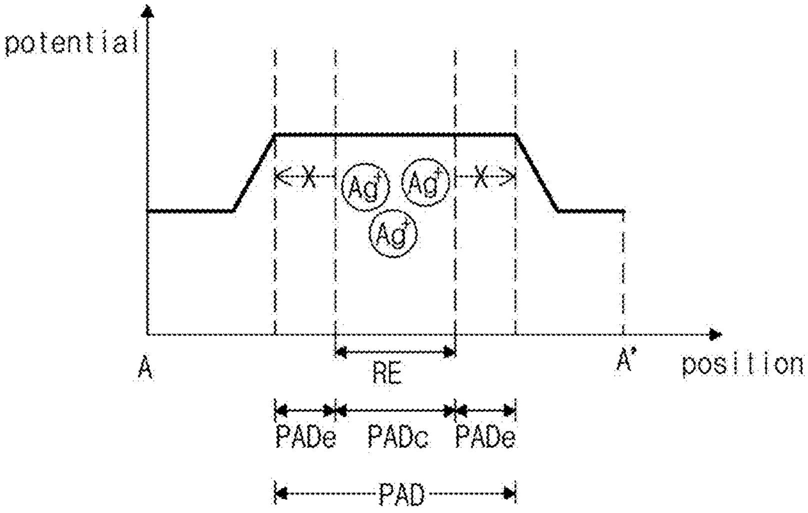
FIG. 15 is a view illustrating a potential distribution of a pad electrode and a routing electrode according to a third embodiment of the present invention.

FIG. 14 is a view schematically illustrating a portion of a non-display area of a display panel of a tiling type display device according to a third embodiment of the present invention. FIG. 15 is a view illustrating a potential distribution of a pad electrode and a routing electrode according to a third embodiment of the present invention, and is a view showing a potential distribution at positions along a line A-A' in FIG. 14.

In the following description, detailed explanations of the same or like parts of the first and second embodiments described above may be omitted.

In FIG. 14, for convenience of explanations, among the plurality of pad electrodes PAD disposed in the non-display area NA of the display panel 100, one clock pad electrode PAD1 receiving the clock signal CLK and two data pad electrodes PAD2 located on both sides of the clock pad electrode PAD1 are shown as an example.

Referring to FIG. 14, in the display panel 100 of this embodiment, a migration prevention structure for a routing electrode RE different from that of the first and second embodiments may be used.

In this regard, for example, in this embodiment, the pad electrode PAD may have a shape and size larger than the routing electrode RE and extending to the outside of the routing electrode RE, and an extension portion PADe of the pad electrode PAD may be formed to surround the routing electrode RE.

As shown in FIG. 15, the extension portion PADe may have the same potential as the routing electrode RE, that is, an equal potential. Accordingly, an electric field does not substantially occur between the extension portion PADe and the routing electrode RE, so that Ag ions (i.e., Ag+) of the routing electrode RE can be prevented from moving to its periphery.

The migration prevention structure for the routing electrode RE using the pad electrode PAD having an extended shape to enclose the routing electrode RE is described in detail.

The pad electrode PAD may include a connecting portion (or overlapping portion) PADc, which overlaps and substantially contacts the corresponding routing electrode RE, and the extension portion PADe extending from the overlapping portion PADc to the outside of the routing electrode RE.

Here, the extension portion PADe of the pad electrode PAD may extend to both sides in the width direction of the routing electrode RE and may extend toward the display area AA in the length direction of the routing electrode RE.

As such, the pad electrode PAD may be formed so that the extension portion PADe surrounds the routing electrode RE.

At this time, an extension width (or length)/of the extension portion PADe of the pad electrode PAD (i.e., a distance from a boundary of the routing electrode RE to an outer boundary of the extension portion PADe) may be set to have a size sufficient to substantially prevent generation of an electric field from the routing electrode RE to surroundings of the routing electrode RE. For example, the width/of the extension portion PADe of the pad electrode PAD may be ½ times or more than a width w of the routing electrode RE, but is not limited thereto.

As described above, the pad electrode PAD may have the extension portion PADe surrounding the routing electrode RE, so that a region of the routing electrode RE region and a region the extension region PADe surrounding the routing electrode RE may achieve an equal potential.

Accordingly, the region of the extension portion PADe having the equal potential acts as a buffer-like region that substantially shields an electric field from the routing electrode RE to its surroundings.

As a result, $Ag^+$ of the routing electrode RE may not substantially move beyond the region of the extension portion PADe and may be positioned in a fixed state on the pad electrode PAD. Therefore, the contact state between the routing electrode RE and the pad electrode PAD is maintained without substantial change, and an electrical open defect between them can be prevented.

Meanwhile, to the display panel 100 of this third embodiment of FIG. 14, the structure using the boost circuit and the conductive pattern, which is the migration prevention structure of the above first or second embodiment, may be applied. For example, the boost circuit (CON of FIG. 6 or 12) of the first or second embodiment may be provided, and the conductive pattern (EP of FIG. 6 or 12) connected to the boost circuit may be disposed around the pad electrode PAD (or the routing electrode RE) in addition to the presence of the extension portion PADe of the pad electrode PAD. As such, when the migration prevention structure of the first or second embodiment and the migration prevention structure of the third embodiment are combined, the effect of preventing ionization migration of the routing electrode RE can be maximized.

Meanwhile, in the above-described embodiments, the display device in which the side routing type display panels are arranged in a tiling type is taken as an example. Alternatively, the above-described embodiments may also be applied to a display device including a single display panel configured in a side routing type.

As described above, according to the embodiments of the present invention, in the side routing type display panel included in the tiling type display device, the boost circuit for generating the output voltage having a higher potential than the Ag paste routing electrode may be provided, and the conductive pattern to which this output voltage is applied may be disposed around the routing electrode.

Accordingly, since the routing electrode becomes a cathode having a low potential with respect to the conductive pattern, the routing electrode is prevented from ionization migration of the Ag paste and can be positioned in a fixed state on the corresponding pad electrode. Therefore, the contact state between the routing electrode and the pad electrode is maintained without substantial change, and an electrical open defect between them can be prevented.

In addition, in the side routing type display panel included in the tiling type display device, the pad electrode may be formed to have the extension portion surrounding the routing electrode of Ag paste.

Accordingly, since the extension having the equal potential acts as a region that substantially shields generation of an electric field toward the peripheral direction from the routing electrode, the routing electrode is prevented from ionization migration of the Ag paste and can be positioned in a fixed state on the corresponding pad electrode. Therefore, the contact state between the routing electrode and the pad electrode is maintained without substantial change, and an electrical open defect between them can be prevented.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:

a plurality of pad electrodes disposed in a non-display area of a substrate of at least one display panel;

a plurality of routing electrodes formed along a top surface, a lateral surface and a rear surface of a side portion of the substrate, respectively connected to the plurality of pad electrodes to transmit corresponding driving signals, and containing Ag paste, a width of one of the routing electrodes being same as or greater than a width of a corresponding one of the pad electrodes in a plan view of the display panel;

a conductive pattern surrounding one or more of the routing electrodes; and a boost circuit that outputs an output voltage obtained by boosting a direct current (DC) input voltage, the output voltage having a higher potential than that of the driving signals and being output to the conductive pattern.

2. The display device of claim 1, wherein the plurality of pad electrodes include a first clock pad electrode receiving a first clock signal and a data pad electrode receiving a data signal, and wherein the output voltage has a higher potential than that of the first clock signal.

3. The display device of claim 2, wherein the boost circuit includes:

a first transistor having a diode connection structure and receiving the input voltage;

a second transistor having a diode connection structure and connected in series with the first transistor with a first node interposed therebetween; and a first capacitor connected between the first node and the first clock pad electrode.

4. The display device of claim 3, wherein the plurality of pad electrodes further include a second clock pad electrode receiving a second clock signal which has a phase different from that of the first clock signal, wherein the boost circuit further includes a third transistor having a diode connection structure and connected in series with the second transistor with a second node interposed therebetween, and a second capacitor connected between the second node and the second clock pad electrode.

5. The display device of claim 3, wherein semiconductor layers of the first and second transistors are integrally formed, and branch off from and extend from the conductive pattern.

6. The display device of claim 1, wherein the conductive pattern includes:

first pattern portions disposed on both sides in a width direction of the routing electrodes electrode; and a second pattern portion connected to the first pattern portions and disposed on a front side in a length direction of the routing electrodes electrode.

7. The display device of claim 1, further comprising a driving circuit disposed on a rear surface of the substrate and connected to the routing electrodes electrode, the driving circuit electrically connected to the pad electrodes via the routing electrodes electrode.

8. The display device of claim 1, wherein the at least one display panel includes a plurality of display panels arranged in a tiling manner, and wherein the routing electrodes electrode of the at least one display panel of the plurality of display panels is disposed at the side portion of the substrate adjacent to a neighboring display panel of the plurality of display panels.

9. A display device, comprising:

a plurality of pad electrodes disposed in a non-display area of a substrate of at least one display panel; and a plurality of routing electrodes formed along a top surface, a lateral surface and a rear surface of a side portion of the substrate, respectively connected to the plurality of pad electrodes to transmit corresponding driving signals, and containing Ag paste, wherein at least one of the pad electrodes includes an extension portion extending beyond a contour of a corresponding routing electrode on which the at least one of the pad electrodes is disposed and surrounding the corresponding routing electrode.

10. The display device of claim 9, wherein a width of the extension portion is equal to or more than ½ times a width of the corresponding routing electrode.

11. The display device of claim 9, wherein further comprising a driving circuit disposed on a rear surface of the substrate and connected to the routing electrodes electrode, the driving circuit electrically connected to the pad electrodes via the routing electrodes electrode.

12. The display device of claim 9, wherein the at least one display panel includes a plurality of display panels arranged in a tiling manner, and wherein the routing electrodes electrode of the at least one display panel of the plurality of display panels is disposed at the side portion of the substrate adjacent to a neighboring display panel of the plurality of display panels.

13. A display device including one or more display panels, at least one of the display panels comprising:

a plurality of pad electrodes disposed in a non-display area of a substrate of the at least one of the display panels;

a driving circuit disposed on the substrate;

a plurality of routing electrodes each electrically connecting a corresponding one of the pad electrodes to the driving circuit, a width of one of the routing electrodes being same as or greater than a width of a corresponding one of the pad electrodes in a plan view of the display panel; and a plurality of conductive patterns each surrounding at least a part of a corresponding one of the routing electrodes, wherein a first voltage is applied to a first one of the conductive patterns;

wherein a second voltage is applied to a first one of the routing electrodes corresponding to and surrounded by the first one of the conductive patterns; and wherein the first voltage is higher than the second voltage.

14. The display device of claim 13, wherein:

the driving circuit is disposed on a rear surface of the substrate; and the first one of the routing electrodes is disposed along a top surface, a side surface, and the rear surface of the substrate.

15. The display device of claim 13, wherein the routing electrodes comprise silver (Ag) paste.

16. The display device of claim 13, wherein the first one of the conductive patterns includes:

first pattern portions disposed on both sides in a width direction of the first one of the routing electrodes; and a second pattern portion connected to the first pattern portions and disposed on a front side in a length direction of the first one of the routing electrodes.

17. The display device of claim 13, further comprising a boost circuit that receives a direct current (DC) input voltage and outputs the first voltage obtained by boosting the DC input voltage.

18. The display device of claim 17, wherein:

the plurality of pad electrodes include a first clock pad electrode receiving a first clock signal and a data pad electrode receiving a data signal, and the first voltage has a higher potential than that of the first clock signal.

19. The display device of claim 18, wherein the boost circuit includes:

a first transistor having a diode connection structure and receiving the DC input voltage;

a second transistor having a diode connection structure and connected in series with the first transistor with a first node interposed therebetween; and a first capacitor connected between the first node and the first clock pad electrode.

20. The display device of claim 19, wherein semiconductor layers of the first and second transistors are integrally formed, and branch off and extend from, the first one of the conductive patterns.

21. The display device of claim 20, wherein:

the plurality of pad electrodes further include a second clock pad electrode receiving a second clock signal which has a phase different from that of the first clock signal, the boost circuit further includes a third transistor having a diode connection structure and connected in series with the second transistor with a second node interposed therebetween, and a second capacitor connected between the second node and the second clock pad electrode.

22. The display device of claim 13, wherein:

the plurality of one or more display panels are arranged in a tiling manner; and the first one of the routing electrodes is disposed along a side surface of the substrate of the at least one of the display panels adjacent to an immediately neighboring one of the display panels.

* * * * *